(12) United States Patent
Kojima et al.

(10) Patent No.: US 7,224,226 B2
(45) Date of Patent: May 29, 2007

(54) AMPLIFYING DEVICE

(75) Inventors: Hiroshi Kojima, Gunma-ken (JP); Yuki Kiri, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 90 days.

(21) Appl. No.: 11/212,310

(22) Filed: Aug. 26, 2005

(65) Prior Publication Data

US 2006/0044062 A1    Mar. 2, 2006

(30) Foreign Application Priority Data

Aug. 26, 2004   (JP)   ............................. 2004-246464

(51) Int. Cl.
*H03F 3/45*   (2006.01)
(52) U.S. Cl. ...................... 330/253; 330/260; 330/9; 330/254
(58) Field of Classification Search ............... 330/253, 330/260, 9, 254
See application file for complete search history.

(56) References Cited

U.S. PATENT DOCUMENTS 3,768,028 A * 10/1973 Wolcott et al. ................. 330/2
5,276,405 A * 1/1994 Mazzucco et al. ........... 330/257
5,570,055 A * 10/1996 Gilbert ....................... 327/350
6,064,261 A * 5/2000 Stein et al. .................. 330/252
6,433,611 B1 * 8/2002 Foroudi et al. ............. 327/333

FOREIGN PATENT DOCUMENTS

JP        2003-243944        8/2003

* cited by examiner

*Primary Examiner*—Patricia Nguyen
(74) *Attorney, Agent, or Firm*—SoCal IP Law Group LLP; Steven C. Sereboff

(57) ABSTRACT

An amplifying device comprising a first terminal to which an alternating signal is inputted; a second terminal connected via an external first resistor to a power supply line; a third terminal to be grounded; a second resistor provided on a signal line in between the second terminal and the third terminal; a differential amplifier, the alternating signal of which being inputted through the first terminal to one input terminal and an output according to the alternating signal being fed back to the other input terminal via a signal line in between the second terminal and the second resistor, and between the one input terminal and the other input terminal, a positive offset voltage higher than a maximum level of the alternating signal being produced in advance; and a third resistor provided between a signal line joining the first terminal and the one input terminal, and a signal line leading to the third terminal. A voltage waveform of the alternating signal that has been amplified on the basis of the resistances of the first and second resistors is produced at the second terminal.

11 Claims, 11 Drawing Sheets

AMPLIFYING DEVICE

CROSS-REFERENCE TO RELATED APPLICATIONS

The present application claims priority from Japanese Patent Application No. 2004-246464 filed on Aug. 26, 2004, which is herein incorporated by reference.

BACKGROUND OF THE INVENTION

1. Field of the Invention

The present invention relates to an amplifying device.

2. Description of the Related Art

In control systems for various fields, analog signals detected by analog sensors have a minute amplitude or low level of current/voltage. Accordingly, in order to amplify the signal to a level that the control system can handle internally, a first-stage amplifier (preamplifier) is provided.

As an example of the control system having such an amplifier, FIG. 12 illustrates an electret condenser microphone (ECM) system that is mainly used as a microphone of a mobile phone on the talking partner side. See, for example, Japanese Patent Application Laid-Open Publication No. 2003-243944.

The ECM system is configured to have a three-terminal amplifier 900 that is an amplifier having a Vin terminal 901, a Vdd terminal 902, and a Gnd terminal 903 wherein a fixed electrode of an electret condenser 203 having its conductive thin film grounded is connected to the Vin terminal 901, a power supply line 201 is connected via a load resistor 200 of resistance R1 to the Vdd terminal 902, and the Gnd terminal 903 is grounded.

The electret condenser 203 has the conductive thin film and the fixed electrode opposite each other. The conductive thin film is charged beforehand by a direct-current power supply of about several tens to 100 volts, and when a voice signal as a condensation-rarefaction wave of air is transmitted to the conductive thin film, the thin film vibrates. Thus, the capacitance Cmic (about 3 pF) of the electret condenser 203 varies thereby producing an alternate voltage waveform (hereinafter, called an alternating signal) according to the variation of the capacitance Cmic. The alternating signal usually has its DC component being at ground potential and a minute amplitude of about several tens mV.

The three-terminal amplifier 900 comprises a junction electric field effect transistor (hereinafter, called a J-FET) 904 having its gate electrode connected to the Vin terminal 901, its drain electrode connected to the Vdd terminal 902, and its source electrode connected to the Gnd terminal 903 thus having the source grounded, and a resistor 905 connected between signal lines respectively leading to the gate electrode and to the source electrode to stabilize the potential of the gate electrode to ground potential.

Here, the following input characteristics are required of the three-terminal amplifier 900 in terms of the input resistance (the resistor 905 and the like) and input capacitance (a parasitic capacitance of the J-FET 904 and the like).

First, the input resistance is required to be of a high resistance value. The electret condenser 203 and the input resistance form a high band pass filter, and in order that a voice signal of about 100 Hz in an audible band is input to the three-terminal amplifier 900 without being attenuated, the resistance of the resistor 905 needs to be of about several hundreds M to several GΩ. Note that letting Rin be the value of the input resistance, the cutoff frequency f1 of the high band pass filter is defined by the following equation 1, $$f1 = 1/(2 \times \pi \times Rin \times Cmic). \tag{1}$$

For example, if the capacitance Cmic of the electret condenser 203 is 3 pF and the cutoff frequency f1 is 50 Hz, the value of the input resistance Rin becomes 1061 MΩ.

Next, the input capacitance is required to be of a low capacitance value. That is, the input capacitance of the three-terminal amplifier 900 is connected in series to the electret condenser 203. Thus, if the value of the input capacitance is large, an alternating signal occurring across the electret condenser 203 will be divided such that the level of the alternating signal at the input of the three-terminal amplifier 900 is reduced. Furthermore, because the value of the input resistance is large, also from the point of view of suppressing the time constant defined as the product of the input resistance and the input capacitance, the input capacitance is required to be of a low capacitance value.

Adopted as an amplifier element used in the three-terminal amplifier 900 is a source-grounded J-FET 904 excellent in balance of high input resistance, low input capacitance, and low noise. Note that letting gm be the conductance of the J-FET 904 and ATTin be an attenuation amount due to the input capacitance and the like, the amplification gain Av of the source-grounded J-FET 904 is defined by the following equation 2:

$$Av = gm \times Rl - ATTin. \tag{2}$$

The amplification gain of the J-FET varies with the conductance gm of the J-FET as shown by equation 2. However, the conductance gm of the J-FET usually varies possibly by about −50 to 200%, and thus conductance gm's are classified into ranks for a management purpose. Even for J-FETs of the same type, variation in the conductance gm causes variation in the amplification gain of the J-FETs, and thus, variation in the amplification gain of amplifiers using the J-FETs (such as three-terminal amplifiers 900) occurs.

Furthermore, as shown in FIG. 13, when the amplification gain of a J-FET is increased, a drain saturation current Idss (about 200 μA) is also to be increased. As the drain saturation current Idss increases, consumption current also increases. Hence, the increase in the amplification gain of the J-FET is restricted for the reason of consumption current. That is, there exists a trade-off relationship between the increase in the amplification gain of a J-FET and reduction in consumption current.

As such, J-FETs as amplifier elements used in amplifiers are excellent in balance of high input resistance, low input capacitance, and low noise, but have the problem that their amplification gain is difficult to adjust.

SUMMARY OF THE INVENTION

To solve the above and other problems, according to a first main aspect of the present invention there is provided an amplifier comprising a first terminal to which an alternating signal is inputted, a second terminal connected via an external first resistor to a power supply line, a third terminal to be grounded, a second resistor provided on a signal line in between the second terminal and the third terminal, a differential amplifier, a positive power supply terminal of which being connected to a signal line in between the second terminal and the second resistor, and a negative power supply terminal of which being connected to the third terminal and of an inverting and a non-inverting input terminals of which, the alternating signal being inputted through the first terminal to one input terminal and an output according to the alternating signal being fed back to the other input terminal via a signal line in between the second terminal and the second resistor, and between the one input terminal and the other input terminal, a positive offset voltage higher than a maximum level of the alternating signal at the one input terminal and relative to ground potential being produced in advance, and a third resistor provided between a signal line joining the first terminal and the one input terminal, and a signal line leading to the third terminal to stabilize a direct current component of the alternating signal inputted to the one input terminal to ground potential, wherein a voltage waveform of the alternating signal that has been amplified on the basis of the resistances of the first resistor and the second resistor is produced at the second terminal.

According to a second main aspect of the present invention there is provided an amplifying device comprising a first terminal to which an alternating signal is inputted, a second terminal connected via an external first resistor to a first power supply line, a third terminal to be grounded, a fourth terminal connected to a second power supply line, a second resistor provided on a signal line in between the second terminal and the third terminal, a differential amplifier, a positive power supply terminal of which being connected to the fourth terminal and a negative power supply terminal of which being connected to the third terminal and of an inverting and a non-inverting input terminals of which, the alternating signal being inputted through the first terminal to one input terminal and an output according to the alternating signal being fed back to the other input terminal via a signal line in between the second terminal and the second resistor, and between the one input terminal and the other input terminal, a positive offset voltage higher than a maximum level of the alternating signal at the one input terminal and relative to ground potential being produced in advance, and a third resistor provided between a signal line joining the first terminal and the one input terminal, and a signal line leading to the third terminal to stabilize a direct current component of the alternating signal inputted to the one input terminal to ground potential, wherein a voltage waveform of the alternating signal that has been amplified on the basis of the resistances of the first resistor and the second resistor is produced at the second terminal.

According to a third main aspect of the present invention there is provided an amplifying device comprising a first terminal to which an alternating signal is inputted, a second terminal connected to a power supply line, a third terminal to be grounded, first and second resistors connected in series on a signal line in between the second terminal and the third terminal, a fourth terminal connected to a signal line in between the first and second resistors, a differential amplifier, a positive power supply terminal of which being connected to the second terminal and a negative power supply terminal of which being connected to the third terminal and of an inverting and a non-inverting input terminals, the alternating signal being inputted through the first terminal to one input terminal and an output according to the alternating signal being fed back to the other input terminal via a signal line in between the first and second resistors, and between the one input terminal and the other input terminal, a positive offset voltage higher than a maximum level of the alternating signal at the one input terminal and relative to ground potential being produced in advance, and a third resistor provided between a signal line joining the first terminal and the one input terminal, and a signal line leading to the third terminal to stabilize a direct current component of the alternating signal inputted to the one input terminal to ground potential, wherein a voltage waveform of the alternating signal that has been amplified on the basis of the resistances of the first resistor and the second resistor is produced at the fourth terminal.

According to a fourth main aspect of the present invention there is provided an amplifying device comprising a first terminal to which an alternating signal is inputted, a second terminal connected to a power supply line, a third terminal to be grounded, a differential amplifier, a positive power supply terminal of which being connected to the second terminal and a negative power supply terminal of which being connected to the third terminal and of an inverting and a non-inverting input terminals, the alternating signal being inputted through the first terminal to one input terminal and an output according to the alternating signal being fed back to the other input terminal via a first resistor, and between the one input terminal and the other input terminal, a positive offset voltage higher than a maximum level of the alternating signal at the one input terminal and relative to ground potential being produced in advance, a second resistor provided between a signal line joining the first resistor and the other input terminal, and a signal line leading to the third terminal, a fourth terminal connected to the output of the differential amplifier, and a third resistor provided between a signal line joining the first terminal and the one input terminal, and a signal line leading to the third terminal to stabilize a direct current component of the alternating signal inputted to the one input terminal to ground potential, wherein a voltage waveform of the alternating signal that has been amplified on the basis of the resistances of the first resistor and the second resistor is produced at the fourth terminal.

According to the present invention, there is provided an amplifier of which the amplification gain is easy to adjust.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the explanation in the present specification and the description of the accompanying drawings.

===Three-Terminal Amplifier===

<First Embodiment>

<<Configuration of a Three-Terminal Amplifier>>

Figure 1:
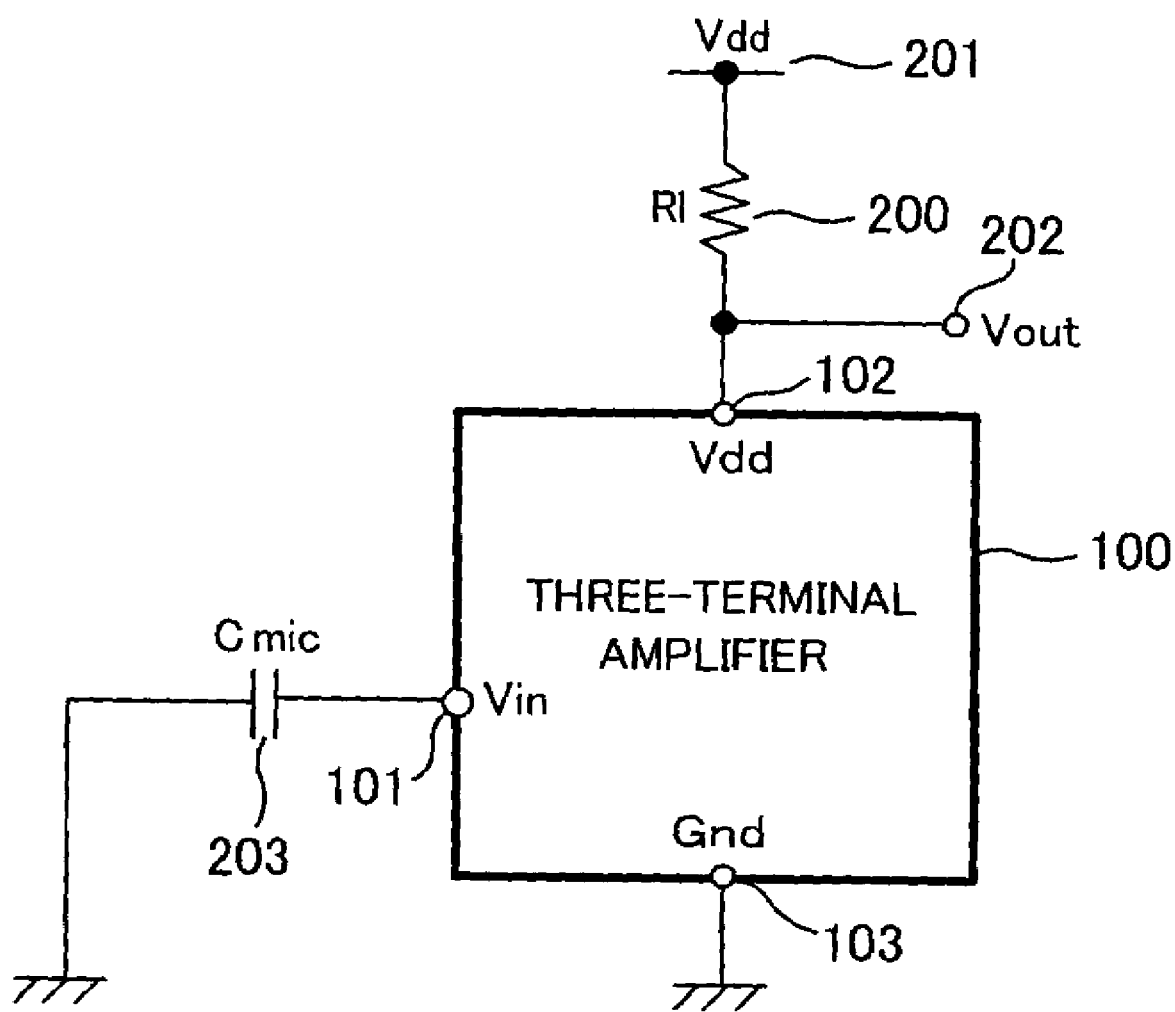
FIG. 1 is a diagram showing the configuration of an ECM system according to an embodiment of the present invention.
Figure 12:
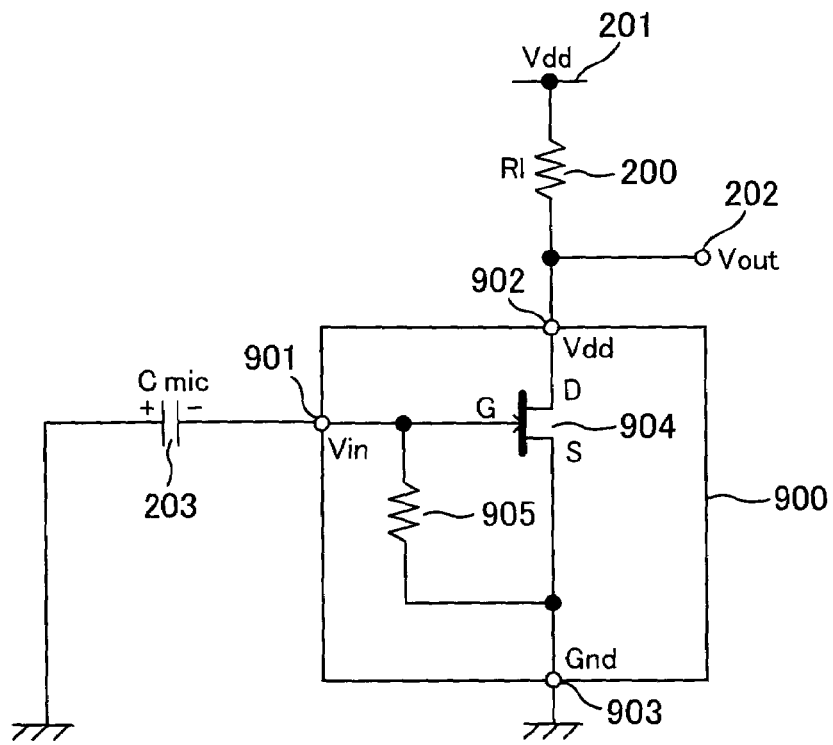
FIG. 12 is a diagram showing the configuration of a conventional ECM system.
Figure 13:
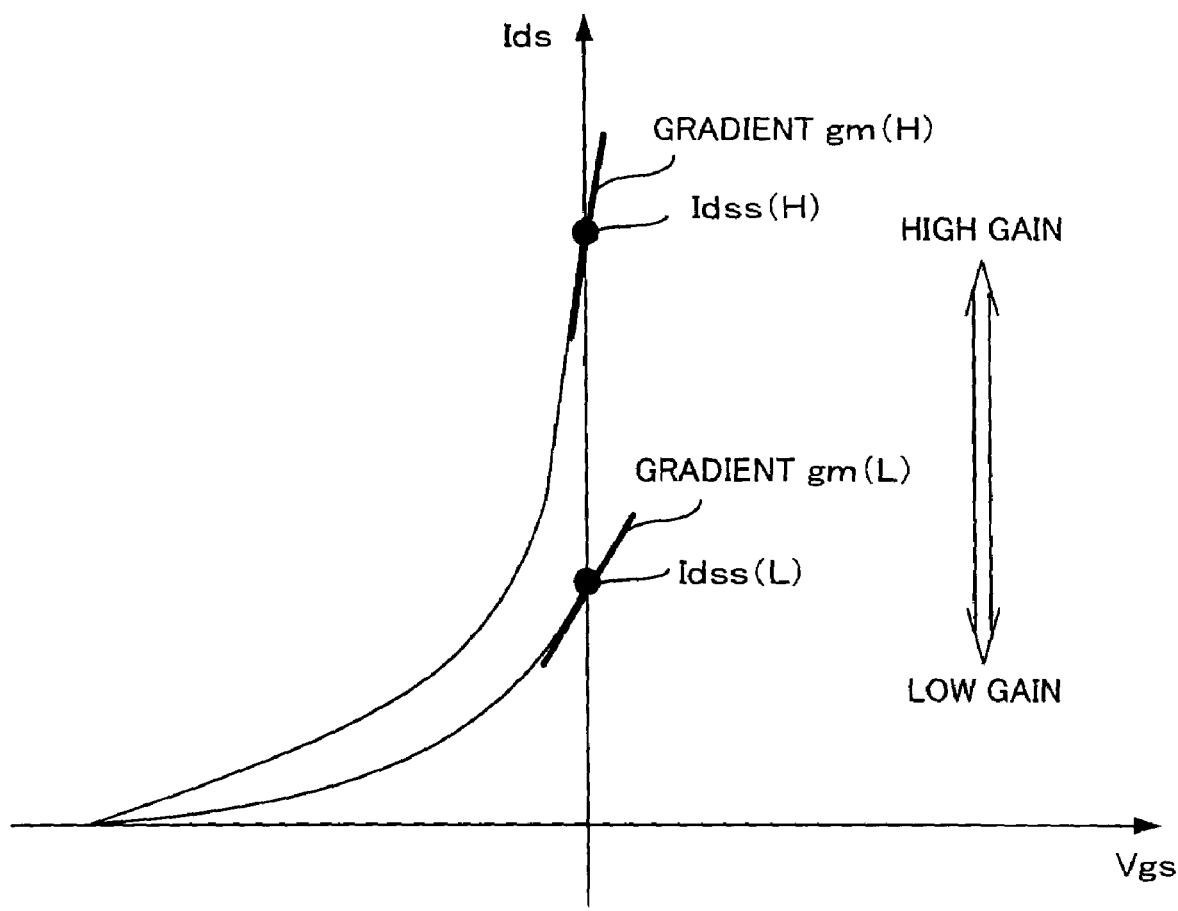
FIG. 13 is a diagram showing a Vgs versus Ids characteristic of a JFET.

FIG. 1 is a diagram showing the configuration of an ECM system using a three-terminal amplifier 100 according to an embodiment of the amplifier recited in claims 1, 2 of this application. Parts externally connected to a Vin terminal 101, a Vdd terminal 102, and a Gnd terminal 103 of the three-terminal amplifier 100 are the same as with the conventional ECM system of FIG. 12, and hence denoted by the same reference numerals.

Figure 2:
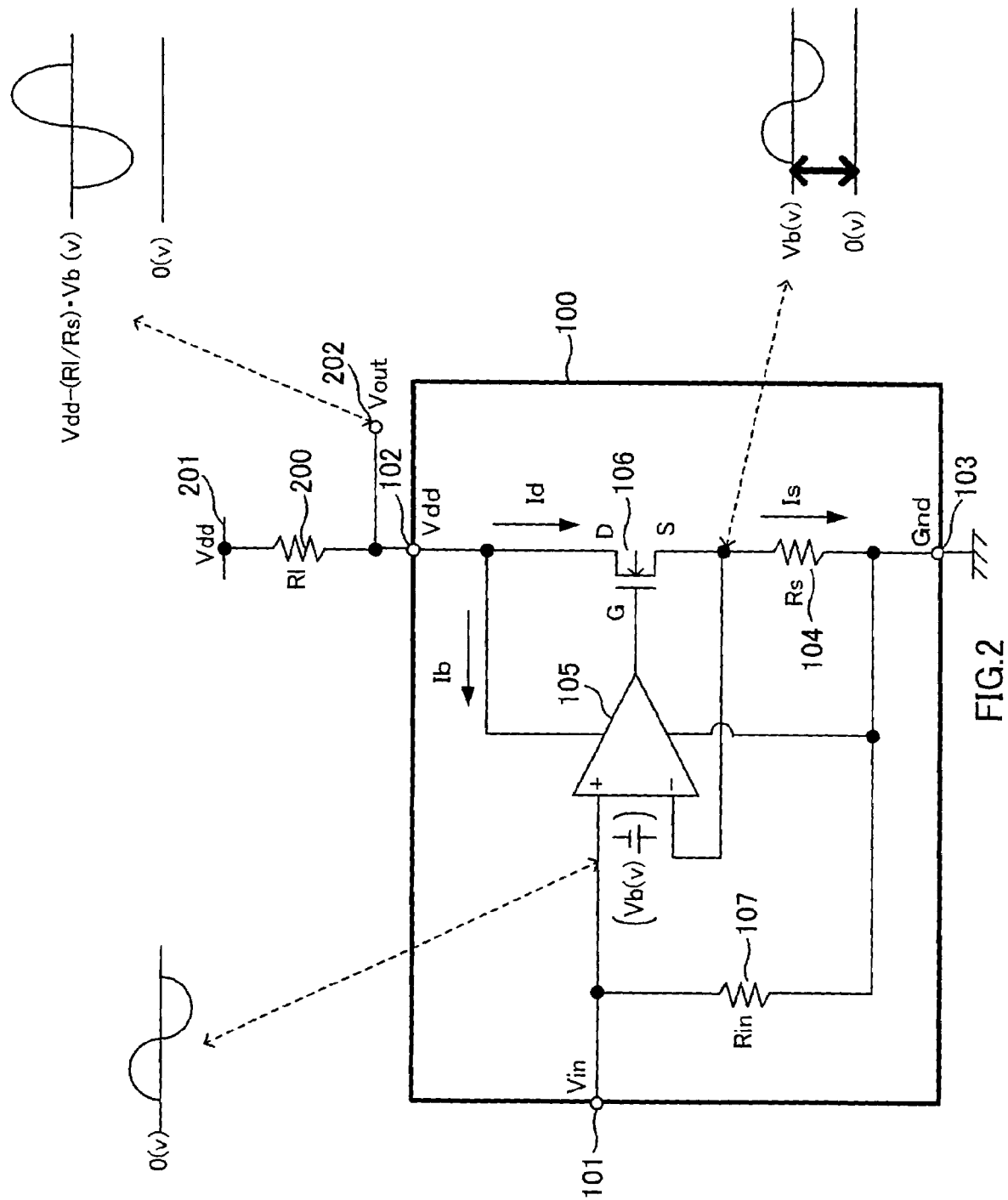
FIG. 2 is a diagram showing the configuration of a three-terminal amplifier according to an embodiment of the present invention.

FIG. 2 is a diagram showing the configuration of the three-terminal amplifier 100. Note that in association with claim 1, the Vin terminal 101 corresponds to a "first terminal", the Vdd terminal 102 to a "second terminal", the Gnd terminal 103 to a "third terminal", the load resistor 200 to a "first resistor", a resistor 104 to a "second resistor", a differential amplifier 105 to a "differential amplifier", and a resistor 107 to a "third resistor". An N-type MOSFET 106 corresponds to a "transistor" recited in claim 2.

The Vin terminal 101 is a terminal to which is input an alternating signal whose direct current component is at ground potential (zero potential). Note that the alternating signal is in the form of an alternating voltage waveform according to a voice signal occurring across the electret condenser 203. The Vdd terminal 102 is a terminal connected via the external load resistor 200 of resistance R1 to the power supply line 201 of supply voltage Vdd. The Gnd terminal 103 is a terminal grounded.

That is, the three-terminal amplifier 100 has the same terminal configuration as the conventional three-terminal amplifier 900 of the conventional ECM system, and hence can be incorporated into the ECM system without a need to change the external circuit for the conventional three-terminal amplifier 900.

The resistor 104 of resistance Rs is provided between signal lines in between the Vdd terminal 102 and the Gnd terminal 103. The resistor 104 in combination with the load resistor 200 is used to set a drain-source current Ids of the N-type MOSFET 106.

The differential amplifier 105 is configured as follows. First, its positive power supply terminal is connected to a signal line in between the Vdd terminal 102 and the resistor 104, and its negative power supply terminal is connected to the Gnd terminal 103. Furthermore, the alternating signal is input to its non-inverting input terminal ("one input terminal") through the Vin terminal 101, and its output according to the alternating signal is fed back to its inverting input terminal ("the other input terminal") through a signal line in between the Vdd terminal 102 and the resistor 104. That is, the differential amplifier 105 is configured as a voltage follower of 1 in amplification gain.

A positive offset voltage Vb that is higher than the maximum level of the alternating signal relative to the direct current component (at ground potential) of the alternating signal inputted to the non-inverting input terminal is produced in advance between the non-inverting input terminal and the inverting input terminal. That is, if the positive offset voltage Vb does not exist between the non-inverting input terminal and the inverting input terminal, the alternating signal inputted to the non-inverting input terminal cannot be reproduced at the connection point of the source electrode of the N-type MOSFET 106 and the resistor 104. This is because with one terminal of the resistor 104 grounded, the alternating signal inputted to the non-inverting input terminal is reproduced as a half-wave waveform having only its positive voltage swing left. Hence, the positive offset voltage Vb produced between the non-inverting input terminal and the inverting input terminal is set higher than the maximum level of the alternating signal inputted to the non-inverting input terminal.

The N-type MOSFET 106 comprises a gate electrode ("control electrode") for controlling to be conductive/non-conductive, a drain electrode ("first electrode") connected to a signal line on the Vdd terminal 102 side, and a source electrode ("second electrode") connected to a signal line on the resistor 104 side, and is provided between signal lines in between the Vdd terminal 102 and the resistor 104, thus being configured as a so-called grounded type. The amplification gain Av of the N-type MOSFET 106 is defined as resistance R1/resistance Rs. The output of the differential amplifier 105 is connected to the gate electrode of the N-type MOSFET 106, and the source electrode of the N-type MOSFET 106 is connected to the inverting input terminal, thereby the output of the differential amplifier 105 is fed back to the inverting input terminal.

The resistor 107 of resistance Rin is provided between a signal line joining the Vin terminal 101 and the non-inverting input terminal and a signal line leading to the Gnd terminal 103. The resistance Rin of the resistor 107 is from about several hundreds MΩ to several GΩ, and is used for stabilizing the direct current component of the alternating signal inputted to the non-inverting input terminal to be at ground potential. The resistor 107 may be replaced by a diode. This is because the potential difference between the anode and cathode electrodes of the diode is almost zero, and the diode will be in a high impedance state. The resistor 107 may be replaced by a transistor made to be always in a conductive state. Note that the transistor in a conductive state is an N-type MOSFET having supply voltage supplied to its gate electrode, a P-type MOSFET having its gate electrode grounded, or the like, which can be handled as being equivalent to a resistor.

As such, the three-terminal amplifier 100 is configured with the differential amplifier 105 instead of a J-FET used in the conventional art. Thus, the three-terminal amplifier 100 produces the voltage waveform of the alternating signal amplified with the amplification gain Av (=resistance R1/resistance Rs) decided by the resistance R1 of the load resistor 200 and the resistance Rs of the resistor 104 at the Vdd terminal 102 and the Vout terminal 202.

The voltage waveform of the alternating signal produced at the Vdd terminal 102 and the Vout terminal 202 is opposite in phase to the alternating signal at the non-inverting input terminal because the source of the N-type MOSFET 106 is grounded. The direct current component of the alternating signal produced at the Vdd terminal 102 and the Vout terminal 202 is equal to supply voltage Vdd minus the voltage drop across the load resistor 200 (=(R1/Rs)·Vb).

Since the three-terminal amplifier 100 does not use a J-FET as in the conventional art, it is not necessary at all to consider variation in the conductance gm of the J-FET. With usual IC processes, variation in resistances R1, Rs can be suppressed to about ±20%, and hence the range of variation in amplification gain can be reduced compared with the case of using a conventional J-FET.

Moreover, for the three-terminal amplifier 100, it is not necessary to classify J-FETs into ranks according to the conductance gm. Accordingly, man-hours can be reduced and yield can be stabilized. Furthermore, with J-FETs, gate leakage is likely to occur at high temperature, but it is not necessary to take into account that point.

Yet further, in the case of using a conventional J-FET, the drain saturation current Idss increases as the amplification gain increases, and hence the amplification gain is restricted for the reason of consumption current. On the other hand, with the three-terminal amplifier 100, the amplification gain can be adjusted on the basis of the resistance R1 of the load resistor 200 and the resistance Rs of the resistor 104 with less effect on consumption current.

As such, according to the three-terminal amplifier 100 of the present invention, the amplification gain can be easily adjusted.

<<Differential Amplifier>>

Figure 3:
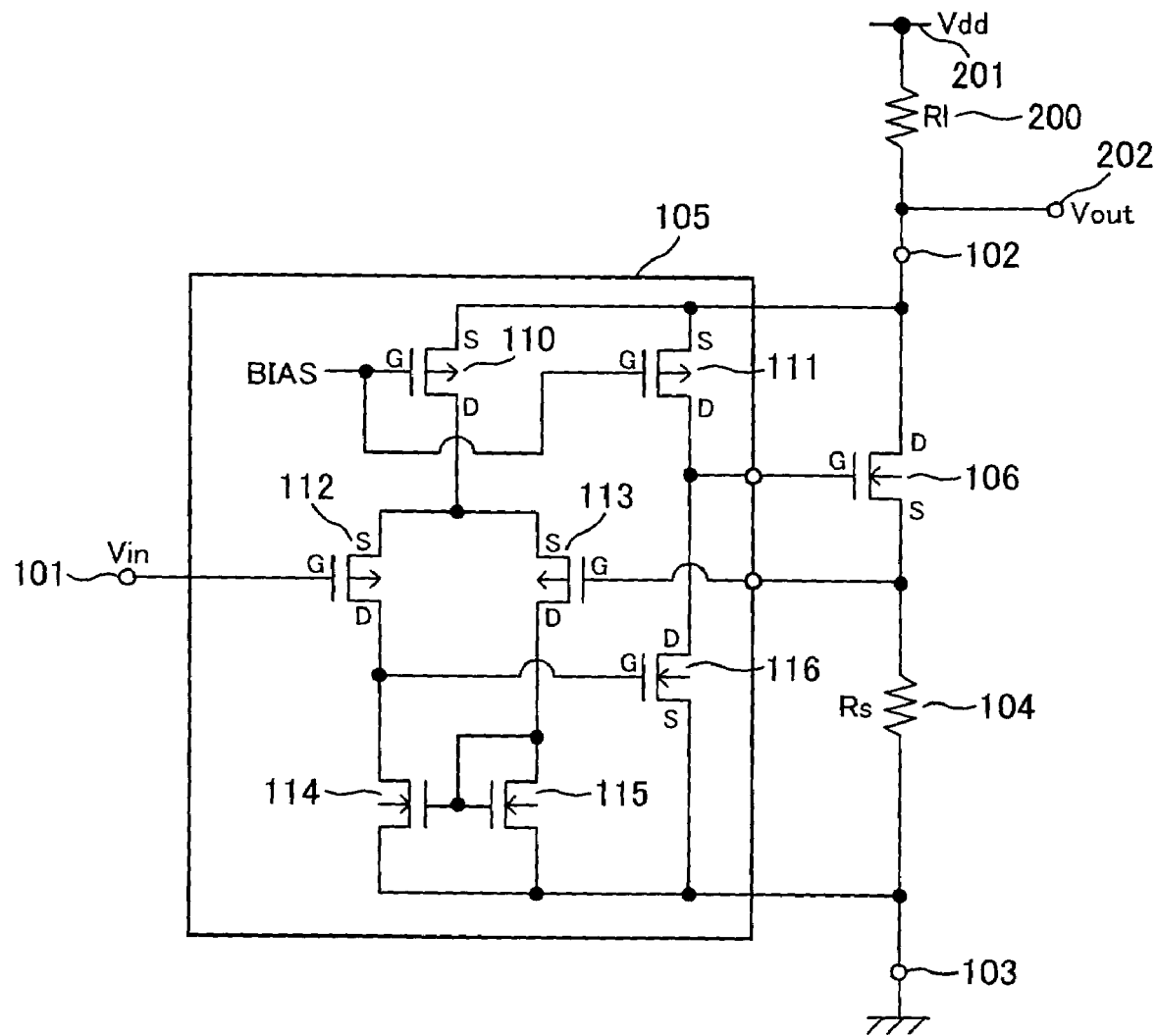
FIG. 3 is a diagram showing the detailed configuration of the three-terminal amplifier according to the embodiment of the present invention.

An example of the detailed configuration of the differential amplifier 105 will be described based on FIG. 3.

The differential amplifier 105 has a differential transistor pair of a P-type MOSFET 112 ("first transistor") having its conductive/non-conductive control gate electrode ("first control electrode") connected to the Vin terminal 101 and the non-inverting input terminal, and a P-type MOSFET 113 ("second transistor") having its conductive/non-conductive control gate electrode ("second control electrode") connected to the connection point of the N-type MOSFET 106 and the resistor 104 and to the inverting input terminal. The respective source electrodes of the differential transistor pair are connected together, and the common source connection point is connected to the drain electrode of a P-type MOSFET 110 having its gate electrode biased and its source electrode connected to the Vdd terminal 102. Further, the drain electrode side of the differential transistor pair is connected to a current mirror circuit.

In the differential amplifier 105, there are connected in series a P-type MOSFET 111 having its gate electrode biased and its source electrode connected to the Vdd terminal 102, and an N-type MOSFET 116 having its gate electrode connected to the output of the current mirror circuit (or the connection point of the P-type MOSFET 112 and the N-type MOSFET 114) and its source electrode connected to the Gnd terminal 103. The connection point of the P-type MOSFET 111 and the N-type MOSFET 116 is connected to the gate electrode of the N-type MOSFET 106.

The differential amplifier 105 with the above configuration operates as follows. That is, a current that flows through the load resistor 200 into the Vdd terminal 102 divides into the drain-source current Ids of the N-type MOSFET 106 and a bias current Is of the differential amplifier 105, and further the bias current Is divides into the respective drain-source currents Ids of the P-type MOSFETs 110, 111.

In the differential transistor pair, the drain-source current Ids of the P-type MOSFET 110 is divided according to the ratio of signal levels inputted respectively to the non-inverting input terminal (the gate electrode of the P-type MOSFET 112) and the inverting input terminal (the gate electrode of the P-type MOSFET 113) into the respective drain-source currents Ids of the P-type MOSFETs 112, 113.

The differential amplifier 105 is configured as a voltage follower, and hence the alternate current components of the signals inputted respectively to the non-inverting input terminal and the inverting input terminal become the same in amplitude. Meanwhile, concerning the direct current components of the signals inputted respectively to the non-inverting input terminal and the inverting input terminal, one on the inverting input terminal side is higher by the offset voltage Vb produced in advance.

Therefore, in the differential transistor pair, a drain-source current Ids smaller by an amount corresponding to the offset voltage Vb flows through the P-type MOSFET 112 compared with the P-type MOSFET 113. For the N-type MOSFET 116, a gate-to-source voltage Vgs corresponding to the difference in the drain-source current Ids is produced. As a result, at the connection point of the source electrode of the N-type MOSFET 106 and the resistor 104, a signal appears which has the same amplitude as the alternating signal inputted to the non-inverting input terminal and whose direct current component is level-shifted by the offset voltage vb relative to ground potential.

The signal appearing at the connection point of the source electrode of the N-type MOSFET 106 and the resistor 104 is converted by the resistor 104 to a current. Because the drain electrode of the N-type MOSFET 106 is connected to the power supply line 201 via the load resistor 200, the same current flows through the load resistor 200 as through the resistor 104. As a result, an output signal appears on the Vout terminal 202, which is opposite in phase to the alternating signal inputted to the non-inverting input terminal and has been amplified with the amplification gain Av (=Rl/Rs). Needless to say, the amplitude of the output signal is adjustable through the resistance R1 of the load resistor 200.

<Offset Voltage Vb>

Figure 4:
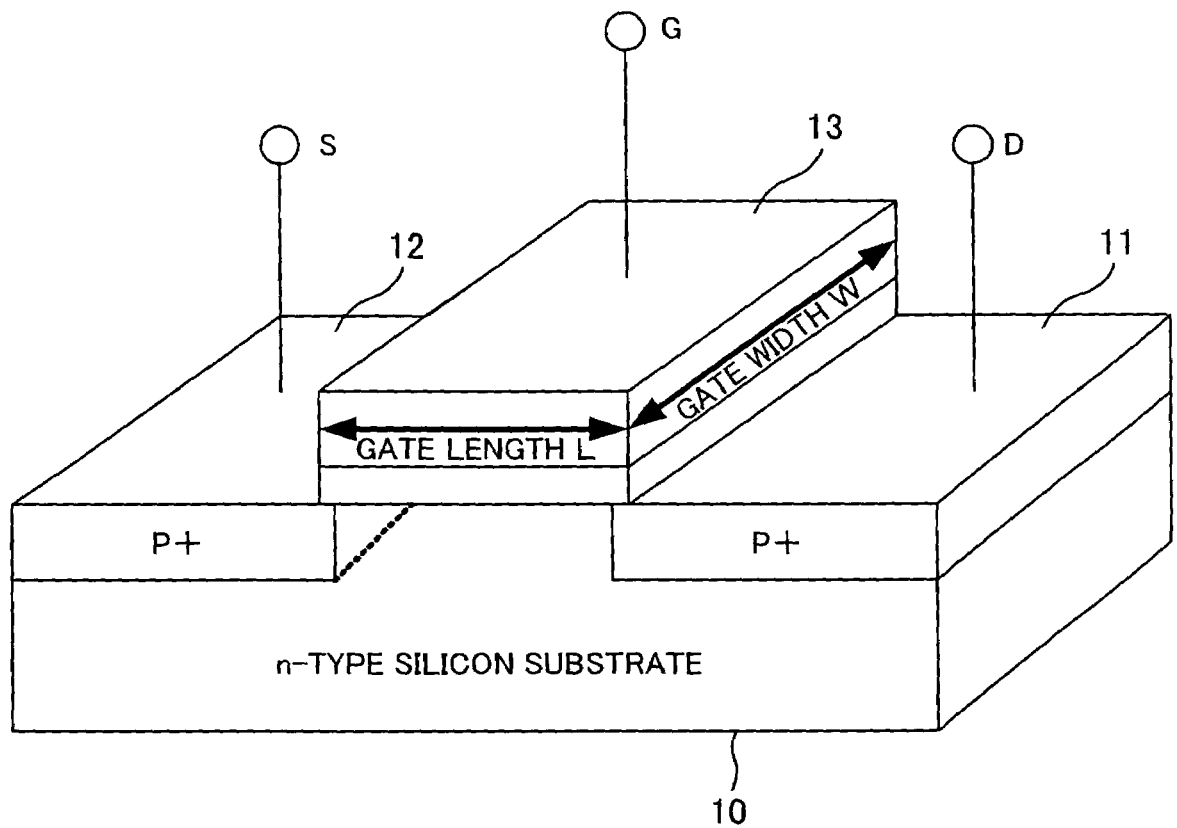
FIG. 4 is a diagram explaining the structure of an N-type MOSFET.

FIG. 4 is a diagram of the P-type MOSFETs 112, 113 forming the differential transistor pair in the differential amplifier 105.

The P-type MOSFETs 112, 113 have a drain electrode 11 and a source electrode 12 of a P-type diffusion layer formed on an N-type silicon substrate 10. A gate electrode 13 is formed on a silicon oxide film on the N-type silicon substrate 10 between the drain electrode 11 and the source electrode 12. The size of the gate electrode 13 is defined by a gate length L and a gate width W.

Hence, the offset voltage Vb between the non-inverting input terminal and the inverting input terminal can be produced in advance, for example, by making the sizes of their gate electrodes 13 different so as to produce an offset voltage between the gate-to-source voltages Vgs of the P-type MOSFETs 112, 113. Specifically, the gate-to-source voltage Vgs of the P-type MOSFET 113 needs to be set smaller than that of the P-type MOSFET 112. Accordingly, the gate width W of the P-type MOSFET 113 is set longer than that of the P-type MOSFET 112, or the gate length L of the P-type MOSFET 113 is set shorter, thereby making the current densities under their gate electrodes 13 different, and thus a desired offset voltage Vb is produced.

<Second Embodiment>

Figure 5:
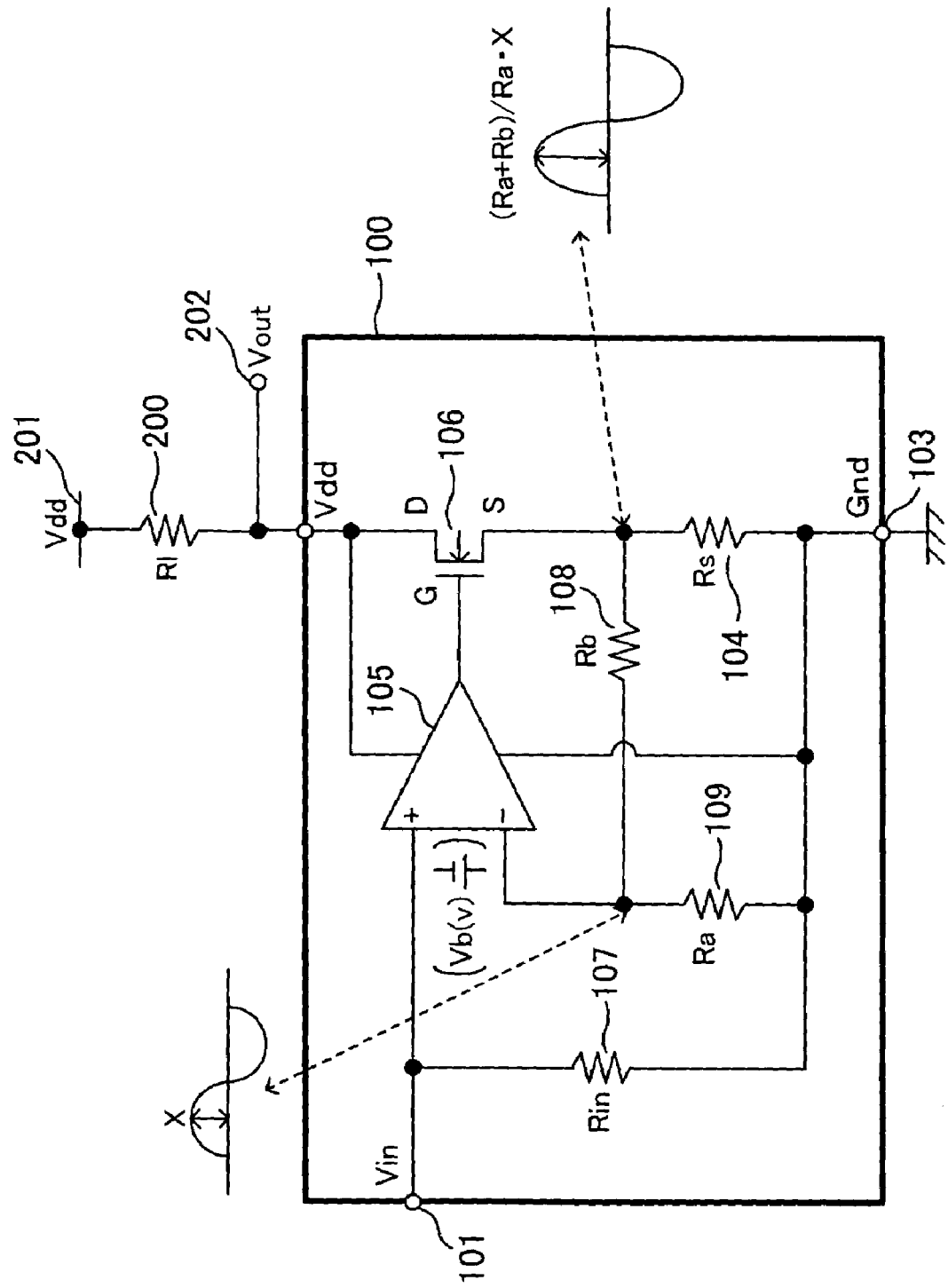
FIG. 5 is a diagram showing the configuration of a three-terminal amplifier according to an embodiment of the present invention.

The three-terminal amplifier 100 of FIG. 5 is the three-terminal amplifier 100 of FIG. 2 having resistors 108, 109 additionally provided therein. Note that the three-terminal amplifier 100 of FIG. 5 corresponds to an "amplifier" recited in claim 3 of this application and that the resistors 108, 109 correspond to a "fourth resistor" and a "fifth resistor" of claim 3, respectively.

The resistor 108 of resistance Rb is provided between the source electrode of the N-type MOSFET 106 and the signal line leading to the inverting input terminal. The resistor 109 of resistance Ra is provided between the signal line to the inverting input terminal from the resistor 108 and a signal line leading to the Gnd terminal 103.

That is, the differential amplifier 105 is configured not as a voltage follower of 1 in amplification gain but as a non-inverting amplifier of (Ra+Rb)/Ra in amplification gain. Hence, letting the amplitude of the alternating signal inputted to the non-inverting input terminal be X, the amplitude of the signal appearing at the connection point of the source electrode of the N-type MOSFET 106 and the resistor 104 is expressed as ((Ra+Rb)/Ra)X, and this three-terminal amplifier 100 is higher in amplification gain than the amplifier 100 of FIG. 2.

With the differential amplifier 105, it is essentially preferable that the respective biases for the transistors of the differential transistor pair are the same. The magnitude of the offset voltage Vb is limited in specification so that distortion in the differential output does not occur. That is, the offset voltage Vb being lower is more preferable. Accordingly, because the three-terminal amplifier 100 of FIG. 5 is higher in amplification gain than the three-terminal amplifier 100 of FIG. 2, a necessary offset voltage Vb between the inverting input terminal and the non-inverting input terminal can be decreased on the basis of the resistance Rb of the resistor 108 and the resistance Ra of the resistor 109.

<Third Embodiment>

Figure 6:
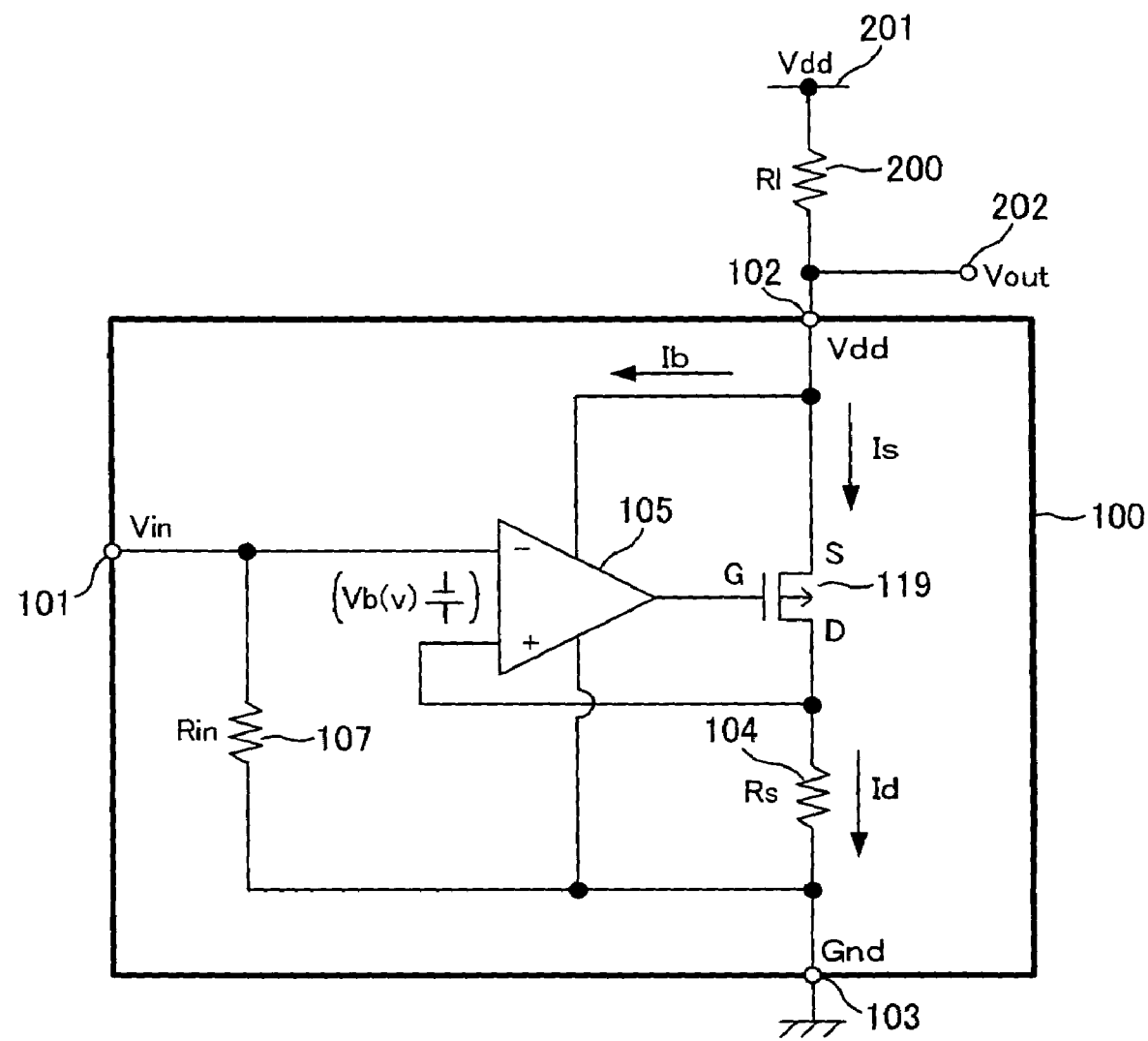
FIG. 6 is a diagram showing the configuration of a three-terminal amplifier according to an embodiment of the present invention.

In the three-terminal amplifier 100 of FIGS. 2, 5, the N-type MOSFET 106 may be replaced by a P-type MOSFET, an NPN bipolar transistor, or a PNP bipolar transistor. FIG. 6 shows the three-terminal amplifier 100 of FIG. 2 having the N-type MOSFET 106 replaced with a P-type MOSFET 119. As shown in FIG. 6, since the arrangement of the source and drain electrodes is flipped compared with the case of the N-type MOSFET 106, the differential amplifier 105 is also flipped in terms of input polarity.

===Four-Terminal Amplifier===

<First Embodiment>

Figure 7:
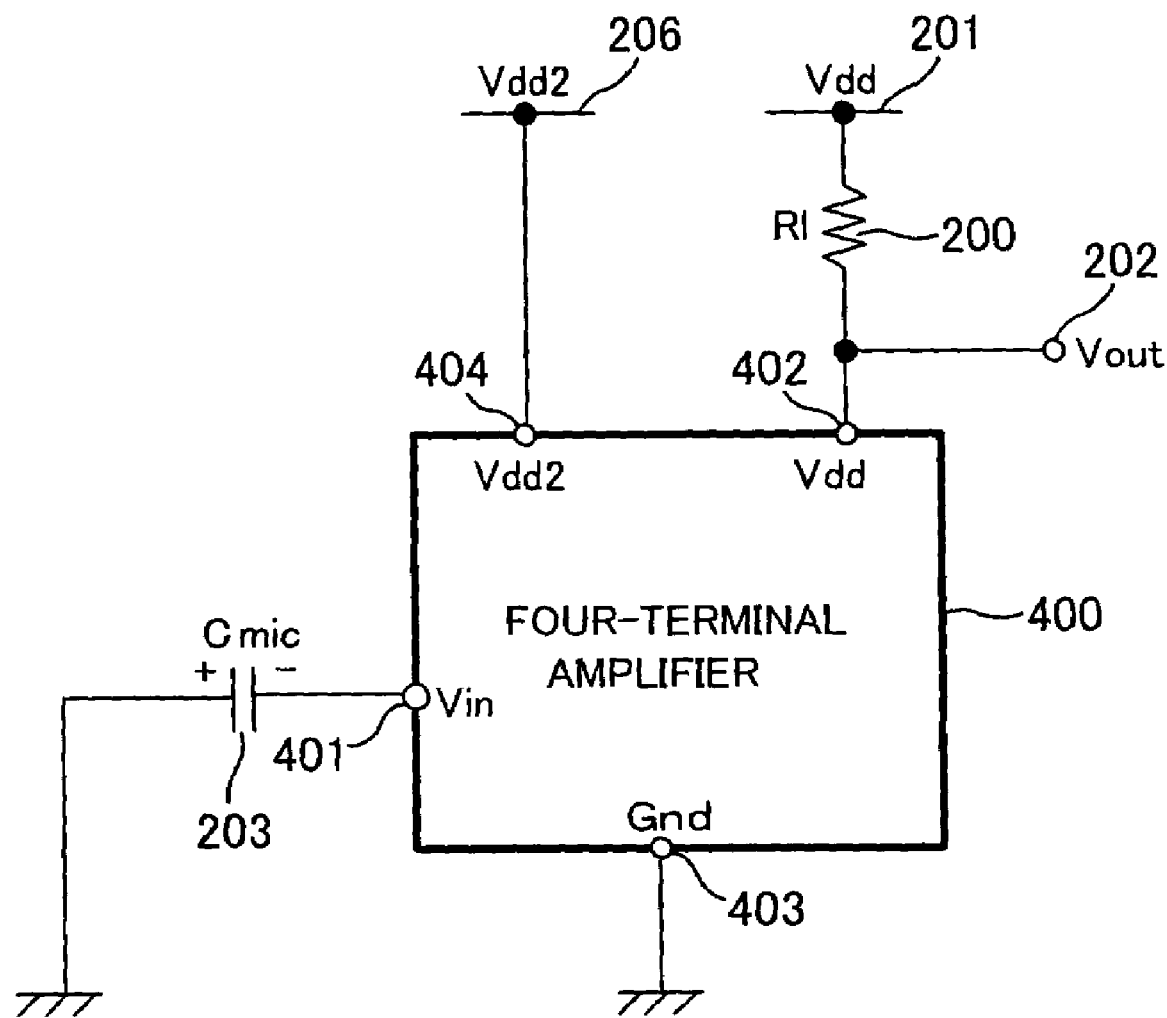
FIG. 7 is a diagram showing the configuration of an ECM system according to an embodiment of the present invention.

FIG. 7 is a diagram showing the configuration of an ECM system using a four-terminal amplifier 400 according to an embodiment of the amplifier recited in claims 4, 5 of this application.

Figure 8:
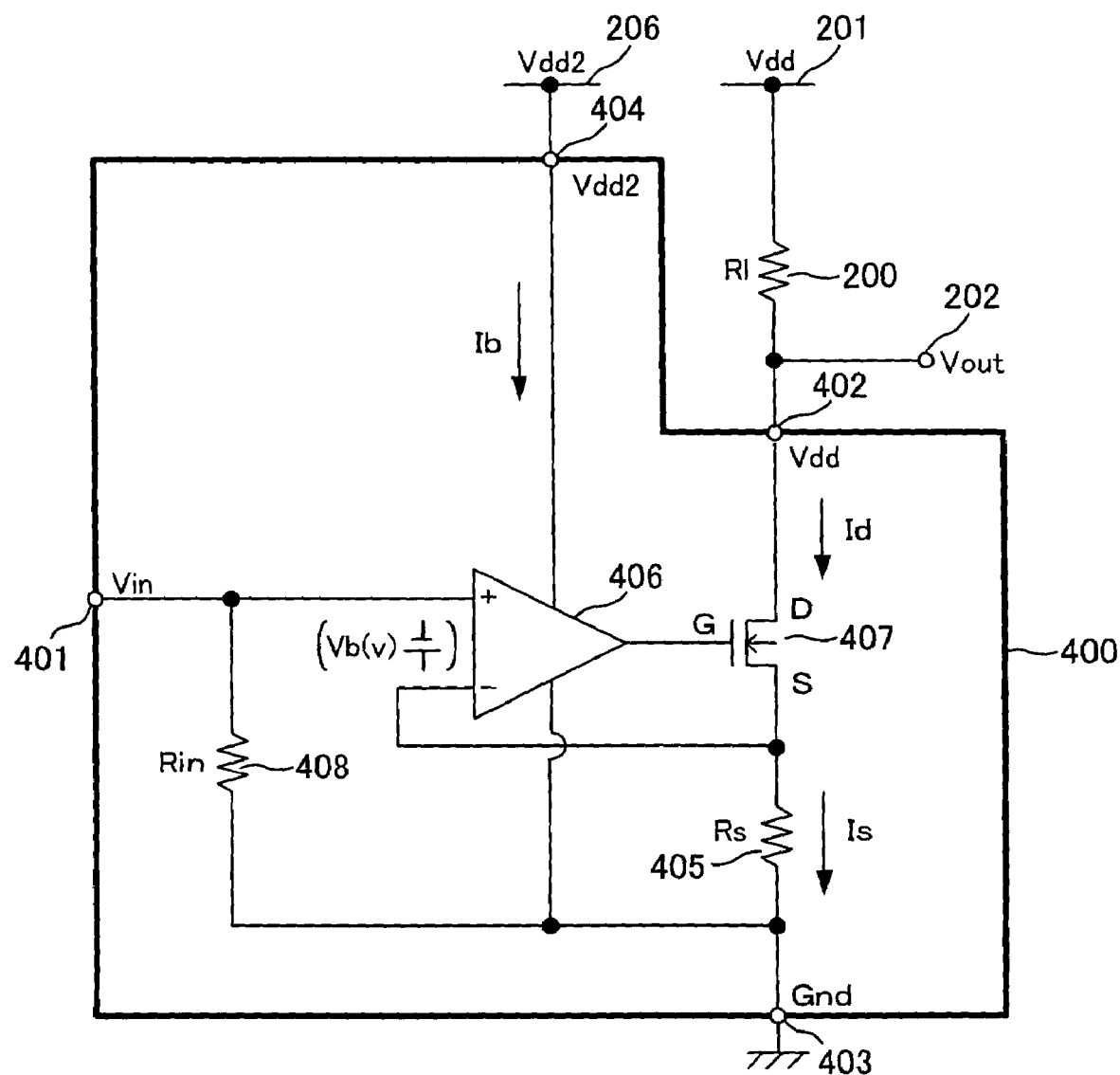
FIG. 8 is a diagram showing the configuration of a four-terminal amplifier according to the embodiment of the present invention.

FIG. 8 is a diagram showing the configuration of the four-terminal amplifier 400. Note that in association with claim 4, a Vin terminal 401 corresponds to a "first terminal", a Vdd terminal 402 to a "second terminal", a Gnd terminal 403 to a "third terminal", a Vdd2 terminal 404 to a "fourth terminal", the load resistor 200 to a "first resistor", a resistor 405 to a "second resistor", a differential amplifier 406 to a "differential amplifier", and a resistor 408 to a "third resistor". An N-type MOSFET 407 corresponds to a "transistor" recited in claim 5.

The Vin terminal 401 is a terminal to which the alternating signal whose direct current component is at ground potential (zero potential) is inputted. The Vdd terminal 402 is a terminal connected via the external load resistor 200 of resistance R1 to the power supply line 201 of supply voltage Vdd. The Gnd terminal 403 is a terminal grounded. The Vdd2 terminal 404 is connected to a power supply line 206 of supply voltage Vdd2 independent of supply voltage Vdd.

The resistor 405 of resistance Rs is provided between signal lines in between the Vdd terminal 402 and the Gnd terminal 403.

The differential amplifier 406 is configured as follows. First, its positive and negative power supply terminals are connected to the Vdd2 terminal 404 and the Gnd terminal 403, respectively. Furthermore, the alternating signal is input to its non-inverting input terminal ("one input terminal") through the Vin terminal 401, and its output according to the alternating signal is fed back to its inverting input terminal ("the other input terminal") through a signal line in between the Vdd terminal 402 and the resistor 405. That is, the differential amplifier 406 is configured as a voltage follower. Furthermore, a positive offset voltage Vb that is higher than the maximum level of the alternating signal relative to the direct current component (at ground potential) of the alternating signal inputted to the non-inverting input terminal is produced in advance between the non-inverting input terminal and the inverting input terminal.

The N-type MOSFET 407 has a conductive/non-conductive control gate electrode ("control electrode") and a drain electrode ("first electrode") connected to a signal line leading to the Vdd terminal 402, and a source electrode ("second electrode") connected to a signal line leading to the resistor 405, and is provided between the signal lines leading to the Vdd terminal 402 and the resistor 405 to be configured as a so-called source grounded type. Thus, the amplification gain Av of the N-type MOSFET 407 is defined as resistance Rl/resistance Rs. The output of the differential amplifier 406 is connected to the gate electrode of the N-type MOSFET 407, and the source electrode of the N-type MOSFET 407 is connected to the inverting input terminal, and thereby the output of the differential amplifier 406 is fed back to the inverting input terminal.

The resistor 408 of resistance Rin (about several hundreds MΩ to several GΩ) is provided between a signal line joining the Vin terminal 401 and the non-inverting input terminal and a signal line leading to the Gnd terminal 403, and is used for stabilizing the direct current component of the alternating signal inputted to the non-inverting input terminal to be at ground potential. As with the resistor 107, the resistor 408 may be replaced by a diode or a transistor in a conductive state.

Since the four-terminal amplifier 400 is basically the same in configuration as the three-terminal amplifier 100, the effect of making the amplification gain easily adjustable is obtained as with three-terminal amplifier 100. The four-terminal amplifier 400 greatly differs in configuration from the three-terminal amplifier 100 in that the Vdd2 terminal 404 is provided and that the supply line of supply voltage Vdd2 supplying to the differential amplifier 406 is separate from the supply line of supply voltage Vdd supplying to the N-type MOSFET 407 via the load resistor 200.

In the case of the three-terminal amplifier 100, a current Ib being supplied to the differential amplifier 105 flows through the load resistor 200. Hence, noise occurring in that current is superimposed on the waveform that appears on the Vout terminal 202, but in the case of the four-terminal amplifier 400, a current Ib being supplied from the power supply line 206 to the differential amplifier 406 does not flow through the load resistor 200. Thus, the four-terminal amplifier 400 is excellent in supply voltage characteristic, and the S/N ratio of the waveform that appears on the Vout terminal 202 is improved.

<Second Embodiment>

Figure 9:
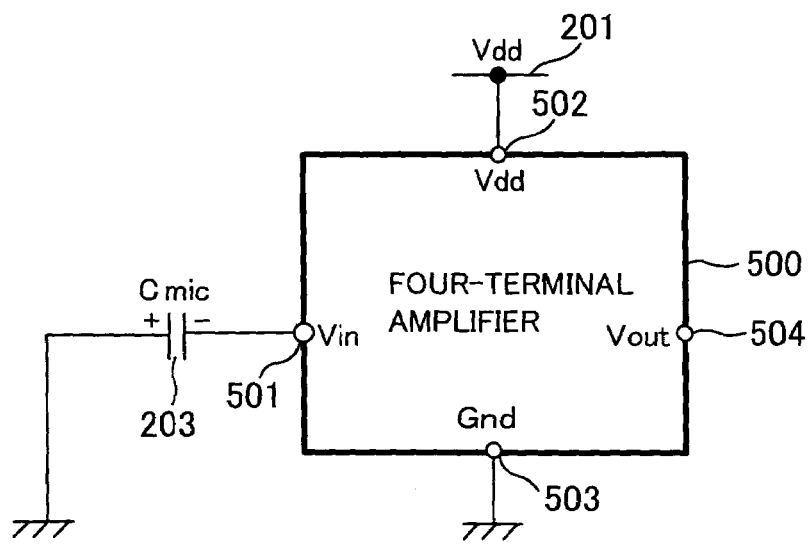
FIG. 9 is a diagram showing the configuration of an ECM system according to an embodiment of the present invention.

FIG. 9 is a diagram showing the configuration of an ECM system using a four-terminal amplifier 500 according to an embodiment of the amplifier recited in claims 6, 7 of this application.

Figure 10:
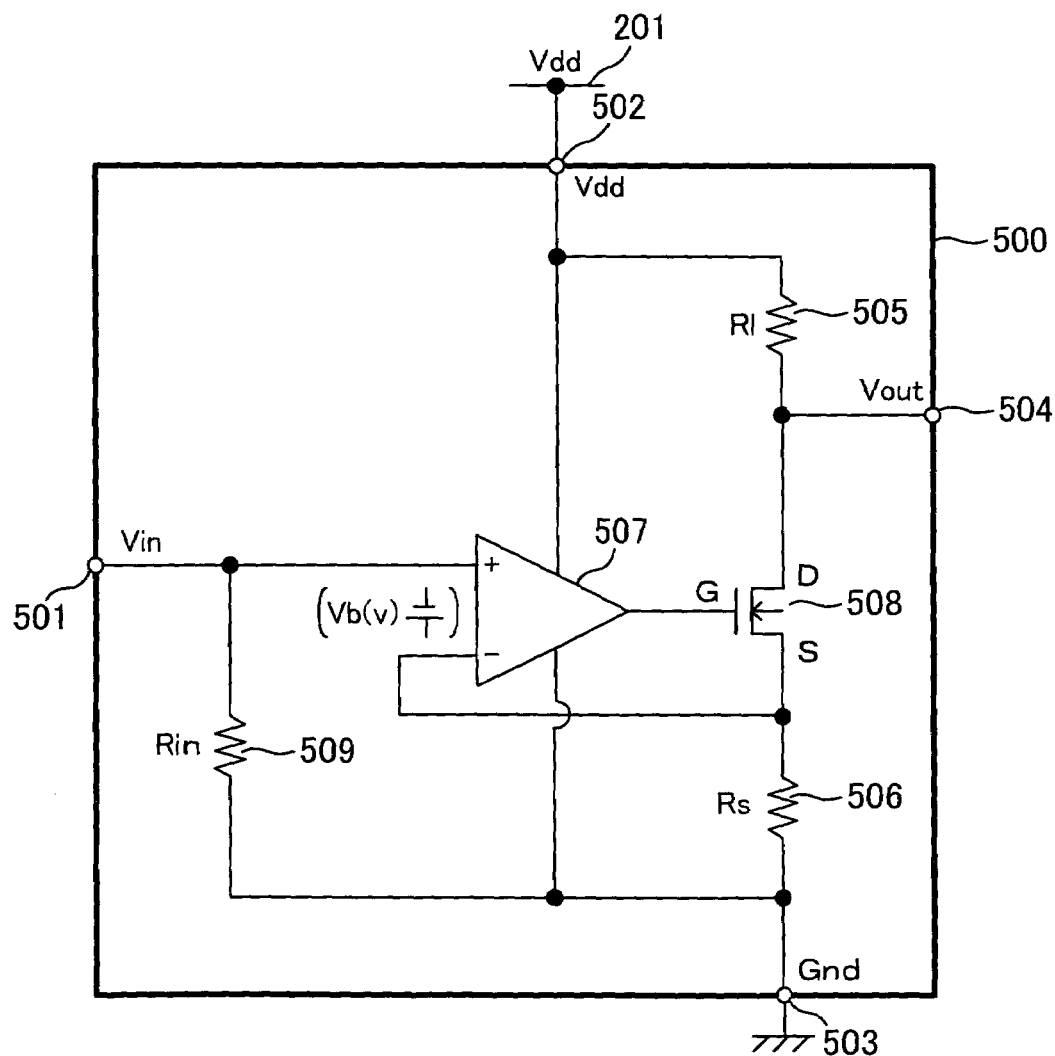
FIG. 10 is a diagram showing the configuration of a four-terminal amplifier according to the embodiment of the present invention.

FIG. 10 is a diagram showing the configuration of the four-terminal amplifier 500. Note that in association with claim 6, a Vin terminal 501 corresponds to a "first terminal", a Vdd terminal 502 to a "second terminal", a Gnd terminal 503 to a "third terminal", a Vout terminal 504 to a "fourth terminal", a load resistor 505 to a "first resistor", a resistor 506 to a "second resistor", a differential amplifier 507 to a "differential amplifier", and a resistor 509 to a "third resistor". An N-type MOSFET 508 corresponds to a "transistor" recited in claim 7.

The Vin terminal 501 is a terminal to which the alternating signal whose direct current component is at ground potential (zero potential) is inputted. The Vdd terminal 502 is a terminal connected to the power supply line 201 of supply voltage Vdd. The Gnd terminal 503 is a terminal grounded. The Vout terminal 504 is connected to the connection point of the load resistor 505 and the resistor 506.

The differential amplifier 507 is configured as follows. First, its positive and negative power supply terminals are connected to the Vdd terminal 502 and the Gnd terminal 503, respectively. Furthermore, the alternating signal is input to its non-inverting input terminal ("one input terminal") through the Vin terminal 501, and its output according to the alternating signal is fed back to its inverting input terminal ("the other input terminal") through a signal line in between the load resistor 505 and the resistor 506. That is, the differential amplifier 507 is configured as a voltage follower. Furthermore, a positive offset voltage Vb that is higher than the maximum level of the alternating signal relative to the direct current component (at ground potential) of the alternating signal inputted to the non-inverting input terminal is produced in advance between the non-inverting input terminal and the inverting input terminal.

An N-type MOSFET 508 has a conductive/non-conductive control gate electrode ("control electrode") and a drain electrode ("first electrode") connected to a signal line leading to the load resistor 505, and a source electrode ("second electrode") connected to a signal line leading to the resistor 506, and is provided between the signal lines leading to the load resistor 505 and the resistor 506 to be configured as a so-called source grounded type. Thus, the amplification gain Av of the N-type MOSFET 508 is defined as resistance Rl/resistance Rs. The output of the differential amplifier 507 is connected to the gate electrode of the N-type MOSFET 508, and the source electrode of the N-type MOSFET 508 is connected to the inverting input terminal, and thereby the output of the differential amplifier 507 is fed back to the inverting input terminal.

The resistor 509 of resistance Rin (about several hundreds MΩ to several GΩ) is provided between a signal line joining the Vin terminal 501 and the non-inverting input terminal, and a signal line leading to the Gnd terminal 503, and is used for stabilizing the direct current component of the alternating signal inputted to the non-inverting input terminal to be at ground potential. As with the resistor 107, the resistor 509 may be replaced by a diode or a transistor in a conductive state.

Since the four-terminal amplifier 500 is basically the same in configuration as the three-terminal amplifier 100 and the four-terminal amplifier 400, the effect of making the amplification gain easily adjustable is obtained as with three-terminal amplifier 100 and the four-terminal amplifier 400.

The four-terminal amplifier 500 greatly differs in configuration from the three-terminal amplifier 100 and the four-terminal amplifier 400 in that the Vout terminal 504 is provided and the load resistor 505, which is external for them, is incorporated therein.

Therefore, in the four-terminal amplifier 500, the ratio of the resistance Rl of the load resistor 505 to the resistance Rs of the resistor 506 can be set in advance according to the required amplification gain. Furthermore, variation in the ratio of the resistance Rl of the load resistor 505 to the resistance Rs of the resistor 506 can be limited to about several % by, for example, placing the load resistor 505 and the resistor 506 adjacent to each other in design with CMOS process.

<Third Embodiment>

Figure 11:
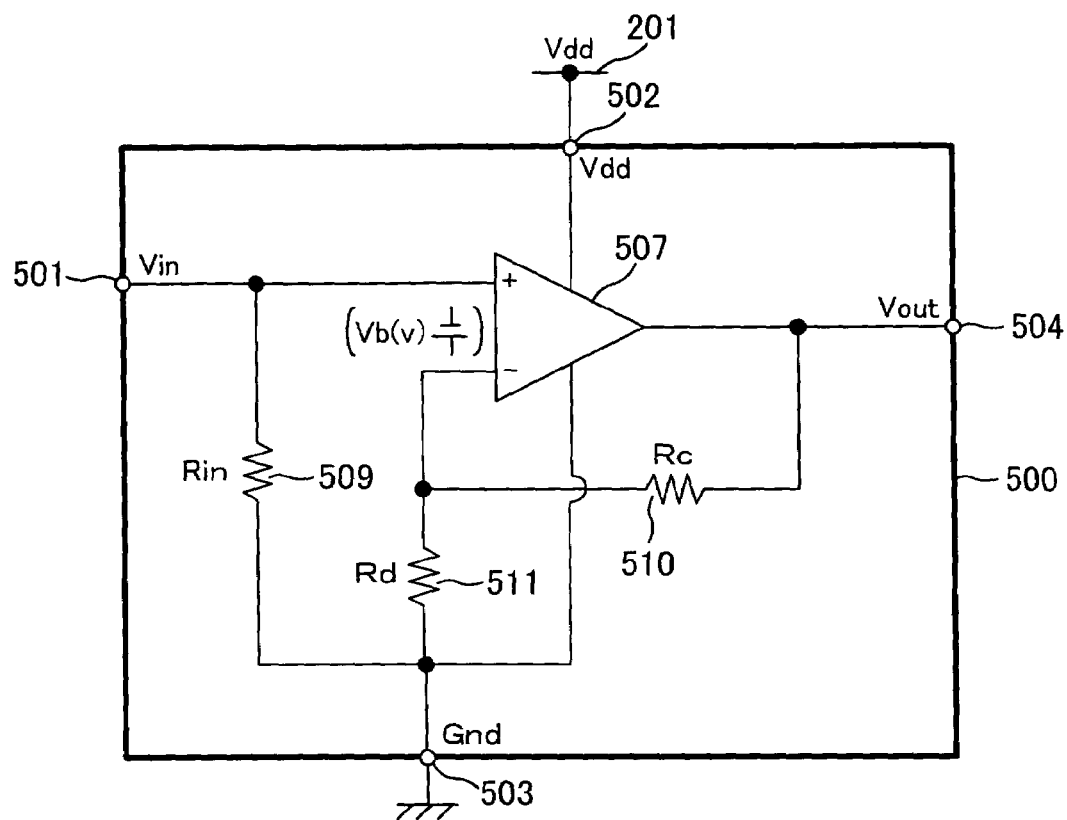
FIG. 11 is a diagram showing the configuration of a four-terminal amplifier according to an embodiment of the present invention.

FIG. 11 is a diagram showing the configuration of a four-terminal amplifier 500 according to an embodiment of the amplifier recited in claim 8 of this application.

In the four-terminal amplifier 500 of FIG. 11, the load resistor 505, the N-type MOSFET 508, and the resistor 506 are removed and resistors 510, 511 are added with respect to the four-terminal amplifier 500 of FIG. 10. Note that in association with claim 8, the resistors 510, 511 correspond to a "first resistor" and a "second resistor" respectively.

In the four-terminal amplifier 500 of FIG. 11, the differential amplifier 507 is configured as follows. First, its positive and negative power supply terminals are connected to the Vdd terminal 502 and the Gnd terminal 503, respectively. Furthermore, the alternating signal is input to its non-inverting input terminal ("one input terminal") through the Vin terminal 501, and its output according to the alternating signal is fed back to its inverting input terminal ("the other input terminal") through the resistor 510 of resistance Rc. And the signal line to the inverting input terminal from the resistor 510 is connected via the resistor 511 of resistance Rd to the Gnd terminal 503. That is, the differential amplifier 507 is configured as a non-inverting amplifier of (Rc+Rd)/Rc in amplification gain. Furthermore, a positive offset voltage Vb that is higher than the maximum level of the alternating signal relative to the direct current component (at ground potential) of the alternating signal inputted to the non-inverting input terminal is produced in advance between the non-inverting input terminal and the inverting input terminal.

In the four-terminal amplifier 500 of FIG. 11, the output of the differential amplifier 507 is connected directly to a Vout terminal 504.

Since the amplification gain of the four-terminal amplifier 500 of FIG. 11 is adjustable through the resistance Rc of the resistor 510 and the resistance Rd of the resistor 511, the effect of making the amplification gain easily adjustable is obtained as with the above embodiments. Also, the configuration is simplified without the N-type MOSFET 508.

<Fourth Embodiment>

In the four-terminal amplifier 400 of FIG. 8, and the four-terminal amplifier 500 of FIGS. 10, 11, the N-type MOSFETs 407, 508 may be replaced by a P-type MOSFET, an NPN bipolar transistor, or a PNP bipolar transistor as in the three-terminal amplifier 300. In the case of replacing with a P-type MOSFET or a PNP bipolar transistor, the differential amplifiers 406, 507 are flipped in terms of input polarity.

Although the preferred embodiments of the present invention have been described, the above embodiments are provided to facilitate the understanding of the present invention and not intended to limit the present invention. It should be understood that various changes and alterations can be made therein without departing from spirit and scope of the invention and that the present invention includes its equivalents.

For example, the application of the three-terminal amplifier 100 and the four-terminal amplifiers 400, 500 is not limited to the first-stage amplifier of ECM systems. In various control systems, the three-terminal amplifier 100 and the four-terminal amplifiers 400, 500 can be used as a first-stage amplifier that amplifies an analog signal detected by an analog sensor to a level that the control system can handle internally.

What is claimed is:

1. An amplifier comprising:
a first terminal to which an alternating signal is inputted;
a second terminal connected via an external first resistor to a power supply line;
a third terminal to be grounded;
a second resistor provided on a signal line in between the second terminal and the third terminal;
a differential amplifier, a positive power supply terminal of which being connected to a signal line in between the second terminal and the second resistor, and a negative power supply terminal of which being connected to the third terminal and of an inverting and a non-inverting input terminals of which, the alternating signal being inputted through the first terminal to one input terminal and an output according to the alternating signal being fed back to the other input terminal via a signal line in between the second terminal and the second resistor, and between the one input terminal and the other input terminal, a positive offset voltage higher than a maximum level of the alternating signal at the one input terminal and relative to ground potential being produced in advance; and
a third resistor provided between a signal line joining the first terminal and the one input terminal, and a signal line leading to the third terminal to stabilize a direct current component of the alternating signal inputted to the one input terminal to ground potential,
wherein a voltage waveform of the alternating signal that has been amplified on the basis of the resistances of the first resistor and the second resistor is produced at the second terminal.

2. The amplifying device according to claim 1, wherein on a signal line in between the second terminal and the second resistor, there is provided a transistor having a control electrode for controlling to be conductive/non-conductive, a first electrode connected to a signal line on the second terminal side, and a second electrode connected to a signal line on the second resistor side,
wherein the output of the differential amplifier is connected to the control electrode, and the second electrode is connected to the other input terminal, thereby feeding back the output of the differential amplifier to the other input terminal, and
wherein a voltage waveform of the alternating signal that has been amplified with an amplification gain defined by the resistance of the first resistor divided by the resistance of the second resistor is produced at the second terminal.

3. The amplifying device according to claim 2, further comprising:
a fourth resistor provided on a signal line in between the second electrode and the other input terminal; and
a fifth resistor provided between a signal line joining the fourth resistor and the other input terminal, and a signal line leading to the third terminal,
wherein the offset voltage necessary between the one input terminal and the other input terminal is decreased on the basis of the resistances of the fourth resistor and the fifth resistor.

4. An amplifying device comprising:
a first terminal to which an alternating signal is inputted;
a second terminal connected via an external first resistor to a first power supply line;
a third terminal to be grounded;
a fourth terminal connected to a second power supply line;
a second resistor provided on a signal line in between the second terminal and the third terminal;
a differential amplifier, a positive power supply terminal of which being connected to the fourth terminal and a negative power supply terminal of which being connected to the third terminal and of an inverting and a non-inverting input terminals of which, the alternating signal being inputted through the first terminal to one input terminal and an output according to the alternating signal being fed back to the other input terminal via a signal line in between the second terminal and the second resistor, and between the one input terminal and the other input terminal, a positive offset voltage higher than a maximum level of the alternating signal at the one input terminal and relative to ground potential being produced in advance; and
a third resistor provided between a signal line joining the first terminal and the one input terminal, and a signal line leading to the third terminal to stabilize a direct current component of the alternating signal inputted to the one input terminal to ground potential,
wherein a voltage waveform of the alternating signal that has been amplified on the basis of the resistances of the first resistor and the second resistor is produced at the second terminal.

5. The amplifying device according to claim 4, wherein on a signal line in between the second terminal and the second resistor, there is provided a transistor having a control electrode for controlling to be conductive/non-conductive, a first electrode connected to a signal line on the second terminal side, and a second electrode connected to a signal line on the second resistor side,
wherein the output of the differential amplifier is connected to the control electrode, and the second electrode is connected to the other input terminal, thereby feeding back the output of the differential amplifier to the other input terminal, and
wherein a voltage waveform of the alternating signal that has been amplified with an amplification gain defined by the resistance of the first resistor divided by the resistance of the second resistor is produced at the second terminal.

6. An amplifying device comprising:
a first terminal to which an alternating signal is inputted;
a second terminal connected to a power supply line;
a third terminal to be grounded;
first and second resistors connected in series on a signal line in between the second terminal and the third terminal;
a fourth terminal connected to a signal line in between the first and second resistors;
a differential amplifier, a positive power supply terminal of which being connected to the second terminal and a negative power supply terminal of which being connected to the third terminal and of an inverting and a non-inverting input terminals, the alternating signal being inputted through the first terminal to one input terminal and an output according to the alternating signal being fed back to the other input terminal via a signal line in between the first and second resistors, and between the one input terminal and the other input terminal, a positive offset voltage higher than a maximum level of the alternating signal at the one input terminal and relative to ground potential being produced in advance; and a third resistor provided between a signal line joining the first terminal and the one input terminal, and a signal line leading to the third terminal to stabilize a direct current component of the alternating signal inputted to the one input terminal to ground potential, wherein a voltage waveform of the alternating signal that has been amplified on the basis of the resistances of the first resistor and the second resistor is produced at the fourth terminal.

7. The amplifying device according to claim 6, wherein on a signal line in between the first and second resistors, there is provided a transistor having a control electrode for controlling to be conductive/non-conductive, a first electrode connected to a signal line on the first resistor side, and a second electrode connected to a signal line on the second resistor side, wherein the output of the differential amplifier is connected to the control electrode, and the second electrode is connected to the other input terminal, thereby feeding back the output of the differential amplifier to the other input terminal, and wherein a voltage waveform of the alternating signal that has been amplified with an amplification gain defined by the resistance of the first resistor divided by the resistance of the second resistor is produced at the fourth terminal.

8. An amplifying device comprising:

a first terminal to which an alternating signal is inputted;

a second terminal connected to a power supply line;

a third terminal to be grounded;

a differential amplifier, a positive power supply terminal of which being connected to the second terminal and a negative power supply terminal of which being connected to the third terminal and of an inverting and a non-inverting input terminals, the alternating signal being inputted through the first terminal to one input terminal and an output according to the alternating signal being fed back to the other input terminal via a first resistor, and between the one input terminal and the other input terminal, a positive offset voltage higher than a maximum level of the alternating signal at the one input terminal and relative to ground potential being produced in advance;

a second resistor provided between a signal line joining the first resistor and the other input terminal, and a signal line leading to the third terminal;

a fourth terminal connected to the output of the differential amplifier; and a third resistor provided between a signal line joining the first terminal and the one input terminal, and a signal line leading to the third terminal to stabilize a direct current component of the alternating signal inputted to the one input terminal to ground potential, wherein a voltage waveform of the alternating signal that has been amplified on the basis of the resistances of the first resistor and the second resistor is produced at the fourth terminal.

9. The amplifying device according to claim 1, wherein the differential amplifier comprises a differential transistor pair of a first transistor, a first control electrode of which for controlling to be conductive/non-conductive being connected to the one input terminal and a second transistor, a second control electrode of which for controlling to be conductive/non-conductive being connected to the other input terminal, and wherein the offset voltage is produced in advance by making the respective sizes of the first and second control electrodes different.

10. The amplifying device according to claim 1, wherein the third resistor is replaced with a diode or a transistor in a conductive state.

11. The amplifying device according to claim 1, wherein the first terminal is connected to one terminal of an electret condenser, of which the other terminal is charged in advance, of an electret condenser microphone, and an alternating signal according to changes in capacitance of the electret condenser on the basis of a voice signal is inputted to the first terminal.

* * * * *